United States Patent
Kawase et al.

(10) Patent No.: US 6,862,803 B2
(45) Date of Patent: Mar. 8, 2005

(54) METHOD FOR MOUNTING ELECTRONIC COMPONENT

(75) Inventors: Takeyuki Kawase, Yamanashi (JP); Junkei Shimizu, Yamanashi (JP); Hiroshi Uchiyama, Yamanashi (JP); Noriaki Yoshida, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 108 days.

(21) Appl. No.: 09/940,743

(22) Filed: Aug. 28, 2001

(65) Prior Publication Data

US 2002/0042989 A1 Apr. 18, 2002

(30) Foreign Application Priority Data

Aug. 29, 2000 (JP) ................................... P. 2000-259327

(51) Int. Cl.[7] ................................................. H05K 3/30
(52) U.S. Cl. ............................. 29/832; 29/833; 29/834; 29/740; 29/743; 29/720; 29/721
(58) Field of Search .......................... 29/712, 720, 759, 29/832, 833, 840, 834, 740, 739, 721, DIG. 44; 356/614; 414/730, 737; 901/40, 46, 47; 294/2, 64.1

(56) References Cited

U.S. PATENT DOCUMENTS

| | | | | |
|---|---|---|---|---|
| 5,539,977 A | * | 7/1996 | Kano et al. | 29/833 |
| 5,751,917 A | * | 5/1998 | Kim et al. | 395/89 |
| 5,911,456 A | * | 6/1999 | Tsubouchi et al. | 29/832 |
| 6,216,336 B1 | * | 4/2001 | Mitsushima et al. | 29/740 |
| 2002/0042989 A1 | * | 4/2002 | Kawase et al. | 29/832 |

FOREIGN PATENT DOCUMENTS

| | | | |
|---|---|---|---|
| EP | 0596533 | * | 5/1993 |
| EP | 0 854 670 | | 7/1998 |
| JP | 4-64283 | * | 2/1992 ................. 29/739 |
| JP | 04230957 | | 8/1992 |
| JP | 08057470 | | 3/1996 |
| WO | 97/48263 | | 12/1997 |

* cited by examiner

Primary Examiner—Minh Trinh
(74) Attorney, Agent, or Firm—Pearne & Gordon LLP

(57) ABSTRACT

A parts mounting method employing a suction section having a plurality of suction nozzles is provided. The suction section is moved to a parts supply section in which a plurality of parts are suctioned by the suction nozzles at the same time. The parts are then mounted onto a board. The suction nozzles are divided into groups: a first group having a shift amount within an allowable range in which simultaneous suction is possible; and a second group having a shift amount outside the allowable range in which simultaneous suction is possible. The parts are then sucked at the same time for each of the groups.

11 Claims, 12 Drawing Sheets

METHOD FOR MOUNTING ELECTRONIC COMPONENT

BACKGROUND OF THE INVENTION

1. Field of the Invention

This invention relates to a parts mounting method and a parts mounting apparatus using a suction section provided with a plurality of suction nozzles for sucking parts stored in a parts supply section onto the suction nozzles of the suction section and mounting the parts on a board with high accuracy.

2. Description of the Related Art

Some electronic parts mounting apparatus for automatically mounting electronic parts on a printed board, etc., each includes a movable suction section provided with a plurality of suction nozzles to suck and hold electronic parts. In this kind of electronic parts mounting apparatus, the suction nozzles and parts supply sections of electronic parts are spaced uniformly and thus when the electronic parts are sucked, it can be expected that all suction nozzles are moved up and down for sucking the electronic parts at the same time with the suction nozzles for improving productivity.

As shown in FIG. 14, in this kind of electronic parts mounting apparatus 1, a move head 3 of a suction section is movable on an X-Y plane and a plurality of (for example, eight) suction nozzles 5 mounted on the move head 3 can be moved up and down and rotated separately. The move head 3 is moved to a parts supply section 7 and electronic parts are sucked to the suction nozzles 5. The suction attitude of each sucked electronic part is recognized in a parts recognition section 9. The attitude of each electronic part is corrected based on the recognition result. On the other hand, in the electronic parts mounting apparatus 1, a printed board brought in from a transport unit 11 is positioned to a predetermined position and the electronic parts whose attitude is corrected are mounted in order at predetermined positions of the printed board.

When the suction nozzles 5 are placed at equal intervals to the parts storage pitch in the parts supply section, if the first suction nozzle 5 is at a position where it can suck a part, it is also made possible for the second to fourth suction nozzles 5 to suck other parts.

However, the electronic parts mounting apparatus 1 cannot make position correction at the parts suction time for each of the suction nozzles 5 and can make position correction only in the move head 3 unit and thus if the shift amount between the center of the suction nozzle 5 and the center of the electronic part is not corrected, only large-sized electronic parts that can be sucked comparatively stably are sucked at the same time.

In recent years, with size and weight reduction of an electronic machine, resistors and capacitors of minute size called 0603, 1005, etc., for example, have been becoming the mainstream of chip-like electronic parts, and the demand for simultaneously sucking such minute electronic parts also rises for the purpose of improving productivity.

However, the electronic parts mounting apparatus in the related art moves the whole suction section, thereby correcting the shift amount at the parts suction time. Thus, large-sized electronic parts for which the shift amount between the center of the suction nozzle and the center of the electronic part need not be corrected can be sucked at the same time, but minute electronic parts for which the shift amount caused by the dimension tolerance, parallelism, etc., of the parts supply section and the nozzles needs to be corrected for each suction nozzle cannot be sucked at the same time because the nozzle center may shift largely from the center of the minute electronic part.

In contrast, if each suction nozzle is provided with a linear motor, etc., and is enabled to move in an XY direction and correction can be made for each suction nozzle, it is also made possible to suck minute electronic parts at the same time. However, if such a mechanism is adopted, the suction section becomes upsized and complicated and is increased in costs; it is not realistic.

It is therefore an object of the invention to provide a parts mounting method and a parts mounting apparatus for making it possible to use suction nozzles similar to those in a related art to simultaneously suck even minute parts formerly unable to be simultaneously sucked unless correction is made for each of the suction nozzles and improve productivity of mounting parts.

SUMMARY OF THE INVENTION

According to the first aspect of the invention there is provided a parts mounting method including the steps of providing a suction section having a plurality of suction nozzles, moving the suction section to a parts supply section in which a plurality of parts are stored so that they can be sucked at the same time, sucking the parts stored in the parts supply section onto the plurality of suction nozzles at the same time, and mounting the sucked parts on a board, wherein all suction nozzles each involving a shift amount within an allowable range in which simultaneous suction is possible are set in one group and suction nozzles each involving a shift amount outside the allowable range in which simultaneous suction is possible are set in a different group and the parts are sucked at the same time for each of the groups.

In this parts mounting method, all suction nozzles each involving a shift amount within the allowable range in which simultaneous suction is possible are set in one group and suction nozzles each involving a shift amount outside the allowable range in which simultaneous suction is possible are set in a different group and the parts are sucked at the same time for each of the groups. Thus, the position of the suction section is corrected for each group, it is made possible substantially to make position correction in the suction nozzle units, and stable parts suction can be performed for each group. Therefore, it is made possible to simultaneously suck even minute parts onto the suction nozzles and productivity of mounting parts can be improved.

According to the second aspect of the invention, there is provided a parts mounting method comprising the steps of providing a suction section having a plurality of suction nozzles, moving the suction section to a parts supply section in which a plurality of parts are stored so that they can be sucked at the same time, sucking the parts stored in the parts supply section onto the plurality of suction nozzles at the same time, and mounting the sucked parts on a board, wherein all suction nozzles each involving the shift amount between the part sucked with the suction nozzle and the suction nozzle is within an allowable range in which simultaneous suction is possible are set in one group and suction nozzles each involving the shift amount outside the allowable range in which simultaneous suction is possible are set in a different group and the parts are sucked at the same time for each of the groups.

In the parts mounting method, all suction nozzles each involving the shift amount between the part sucked with the suction nozzle and the suction nozzle is within the allowable range in which simultaneous suction is possible are set in one group and suction nozzles each involving the shift amount outside the allowable range in which simultaneous suction is possible are set in a different group and the parts are sucked at the same time for each of the groups. Thus, variations in the suction nozzle positions and variations in the parts supply positions of the parts supply section are corrected, so that stable parts suction is accomplished if the simultaneous suction operation of all suction nozzles is performed.

The parts mounting method according to the third aspect of the invention is as follows: In the parts mounting method of the second aspect, a position correction value of the suction section is calculated based on the shift amount for each of the groups and the suction section is corrected based on the position correction value and the parts are sucked at the same time for each of the groups.

In the parts mounting method of the third aspect, the suction section is corrected based on the position correction value and the parts are sucked at the same time for each of the groups, whereby stable parts suction can be executed in each group.

The parts mounting method according to the fourth aspect of the invention is as follows: In the parts mounting method of the third aspect, the position correction value of the suction section is the average value of the maximum value and the minimum value of the shift amount between the center of each suction nozzle and the center position of a part at a parts suction position.

In the parts mounting method of the fourth aspect, the position correction value of the suction section is the average value of the maximum value and the minimum value of the shift amount between the center of each suction nozzle and the center position of a part at a parts suction position, so that the move distances of the suction section are averaged relative to the suction nozzles, and more stable suction operation is made possible.

The parts mounting method according to the fifth aspect of the invention is as follows: In the parts mounting method of the second aspect, the positions of the plurality of suction nozzles are detected and the shift amount between the center of each suction nozzle and the center position of a part at a parts suction position is calculated from the detected position of each suction nozzle.

In the parts mounting method of the fifth aspect, the position of each suction nozzle is detected, whereby the shift amount between the center of the suction nozzle and the center position of the part at the parts suction position is calculated.

The parts mounting method according to the sixth aspect of the invention is as follows: In the parts mounting method of the fifth aspect, the tip face of each suction nozzle is recognized and the center position of the suction nozzle is detected.

In the parts mounting method of the sixth aspect, the tip face of each suction nozzle is checked, whereby the center position of the suction nozzle can be detected easily.

The parts mounting method according to the seventh aspect of the invention is as follows: In the parts mounting method of the sixth aspect, an inspection jig is placed on each suction nozzle and the center position of the suction nozzle is detected.

In the parts mounting method of the seventh aspect, the inspection jig placed on the suction nozzle is imaged from below and a center mark provided at a position matching the center position of the suction nozzle or in the surrounding of the center position is detected, whereby the center position of the suction nozzle is obtained.

The parts mounting method according to the eighth aspect of the invention is as follows: In the parts mounting method of the third aspect, the shift amount between the center of each suction nozzle and the center of a part is found by a parts recognition unit for recognizing the suction state of the part onto the suction nozzle and the group of the suction nozzles where the simultaneous suction operation is to be performed and the position correction value of the suction section for each group are changed in response to the shift amount found by the parts recognition unit.

In the parts mounting method of the eighth aspect, the shift amount between the center of each suction nozzle and the center of a part is found by the parts recognition unit and the group of the suction nozzles where the simultaneous suction operation is to be performed and the position correction value of the suction section for each group are changed in response to the found shift amount, so that stable simultaneous suction matching the shift amount between the actual suction nozzle and parts centers can be accomplished.

The parts mounting method according to the ninth aspect of the invention is as follows: In the parts mounting method of the first aspect, a suction nozzle where a parts suction mistake has occurred exceeding an allowable number of times or a suction nozzle where the parts suction ratio is an allowable value or less is classified into a specific group for performing suction operation.

In the parts mounting method of the ninth aspect, if there are variations in suction forces of the suction nozzles, etc., it is made possible to make finer position correction to a suction nozzle with a low suction ratio in such a manner that a point near a parts center position as much as possible is sucked with the suction nozzle, and the stable suction operation with each suction nozzle can be accomplished.

The parts mounting method according to the tenth aspect of the invention is as follows: In the parts mounting method of the first aspect, it is made possible to set the allowable range in which simultaneous suction is possible in multiple steps so that grouping for performing simultaneous suction is set in multiple steps between a mode giving high priority to productivity and a mode giving high priority to the parts suction ratio.

In the parts mounting method of the tenth aspect, grouping for performing simultaneous suction is set in multiple steps between a mode giving high priority to productivity (throughput, etc.,) and a mode giving high priority to the suction ratio. That is, the width W of the allowable range of the group width is set wide to give high priority to productivity, and is set narrow to give high priority to the suction ratio. Therefore, the user can perform the suction operation in any desired mode selected in response to the purpose.

The parts mounting method according to the eleventh aspect of the invention is as follows: In the parts mounting method of the second aspect, the shift amount between the center of a part at a parts suction position and the center of each suction nozzle is corrected by changing the feed amount of the part in the parts supply section.

In the parts mounting method of the eleventh aspect, the shift amount between the center of a part at a parts suction position and the center of each suction nozzle can be corrected by changing the feed amount of the part in the parts supply section.

According to the twelfth aspect of the invention, there is provided a parts mounting apparatus comprising a suction section provided with a plurality of suction nozzles, a parts supply section in which a plurality of parts are stored so that they can be sucked at the same time, and a control section for performing control so as to move the suction section to the parts supply section, suck the parts stored in the parts supply section onto the plurality of suction nozzles at the same time, and mount the sucked parts on a board, the control section performs control so that all suction nozzles each involving the shift amount between the part sucked with the suction nozzle and the suction nozzle is within an allowable range in which simultaneous suction is possible are set in one group and suction nozzles each involving the shift amount outside the allowable range in which simultaneous suction is possible are set in a different group and the parts are sucked at the same time for each of the groups.

In the parts mounting apparatus, the control section performs control so that all suction nozzles each involving the shift amount between the part sucked with the suction nozzle and the suction nozzle is within the allowable range in which simultaneous suction is possible are set in one group and suction nozzles each involving the shift amount outside the allowable range in which simultaneous suction is possible are set in a different group and the parts are sucked at the same time for each of the groups, whereby the position of the suction section is corrected for each group, it is made possible substantially to make position correction in the suction nozzle units, and stable parts suction can be performed for each group. Therefore, it is made possible to simultaneously suck even minute parts onto the suction nozzles and productivity of mounting parts can be improved.

The parts mounting apparatus according to the thirteenth aspect of the invention is as follows: In the parts mounting apparatus of the twelfth aspect, the control section calculates a position correction value of the suction section based on the shift amount for each of the groups and corrects the suction section based on the position correction value.

In the parts mounting apparatus of the thirteenth aspect, the control section corrects the suction section based on the position correction value and causes the parts to be sucked at the same time for each of the groups, whereby stable parts suction can be performed for each group.

The parts mounting apparatus according to the fourteenth aspect of the invention is as follows: In the parts mounting apparatus of the thirteenth aspect, the position correction value of the suction section is the average value of the maximum value and the minimum value of the shift amount between the center of each suction nozzle and the center position of a part at a parts suction position.

In the parts mounting apparatus of the fourteenth aspect, the control section adopts as the position correction value of the suction section, the average value of the maximum value and the minimum value of the shift amount between the center of each suction nozzle and the center position of a part at the parts suction position, so that the move distances of the suction section are averaged relative to the suction nozzles, and more stable suction operation is made possible.

The parts mounting apparatus according to the fifteenth aspect of the invention is as follows: The parts mounting apparatus of the twelfth aspect further comprises a database storing as many data pieces of the shift amount between the center of each suction nozzle and the center position of a part at each parts suction position as the number of combinations of the number of the suction nozzles and the number of the parts suction positions.

The parts mounting apparatus of the fifteenth aspect comprises the database storing as many data pieces of the shift amount between the center of each suction nozzle and the center position of a part at each parts suction position as the number of combinations of the number of the suction nozzles and the number of the parts suction positions, so that the shift amount between the suction nozzle center and the parts center at the parts suction position can be added for making correction.

The parts mounting apparatus according to the sixteenth aspect of the invention is as follows: The parts mounting apparatus of the thirteenth aspect further comprises a parts recognition unit for recognizing the suction state of each part onto each suction nozzle, wherein the control section finds the shift amount between the center of each suction nozzle and the center of a part by the parts recognition unit and changes the group of the suction nozzles where the simultaneous suction operation is to be performed and the position correction value of the suction section for each group in response to the shift amount.

In the parts mounting apparatus of the sixteenth aspect, the control section finds the shift amount between the center of each suction nozzle and the center of a part and changes the group of the suction nozzles where the simultaneous suction operation is to be performed and the position correction value of the suction section for each group in response to the shift amount. Accordingly, stable simultaneous suction matching the shift amount between the actual suction nozzle and parts centers can be accomplished.

MODE FOR CARRYING OUT THE INVENTION

Referring now to the accompanying drawings, there are shown preferred embodiments of electronic parts mounting methods according to the invention.

First, an electronic parts mounting apparatus used with the electronic parts mounting methods according to the invention will be discussed.

Figure 1:
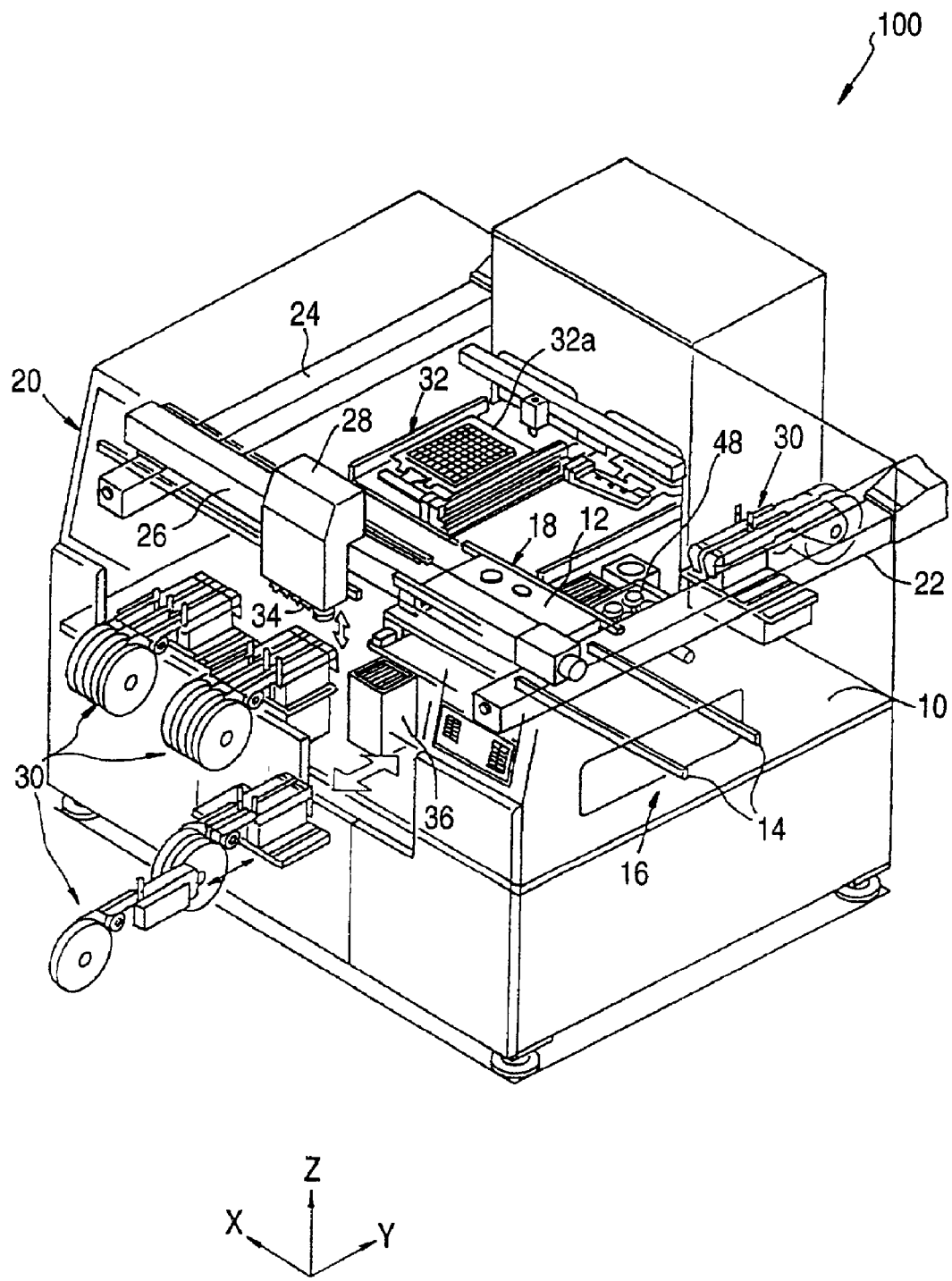
FIG. 1 is a perspective view of an electronic parts mounting apparatus used with the invention.
Figure 2:
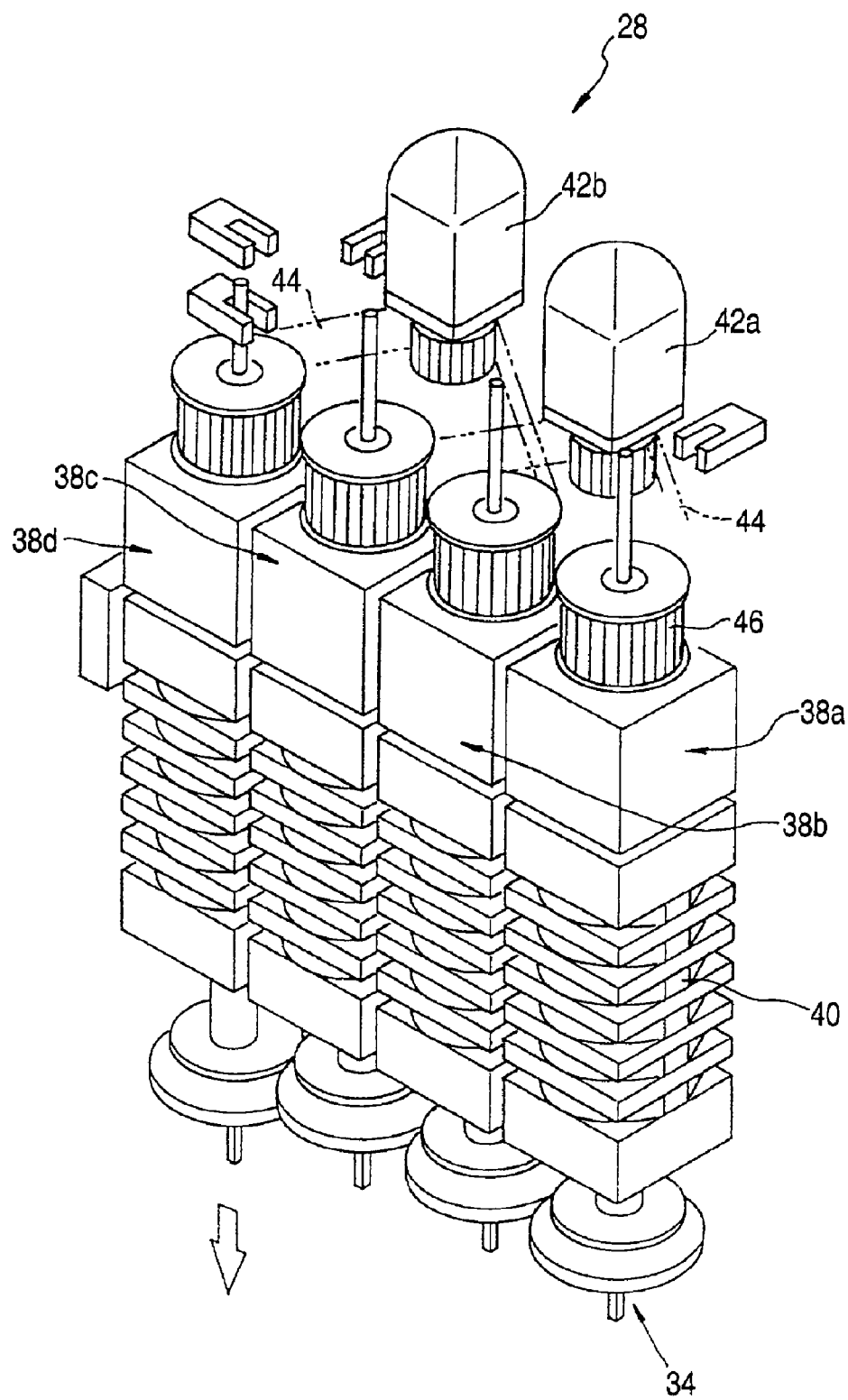
FIG. 2 is an enlarged perspective view of a move head.
Figure 3:
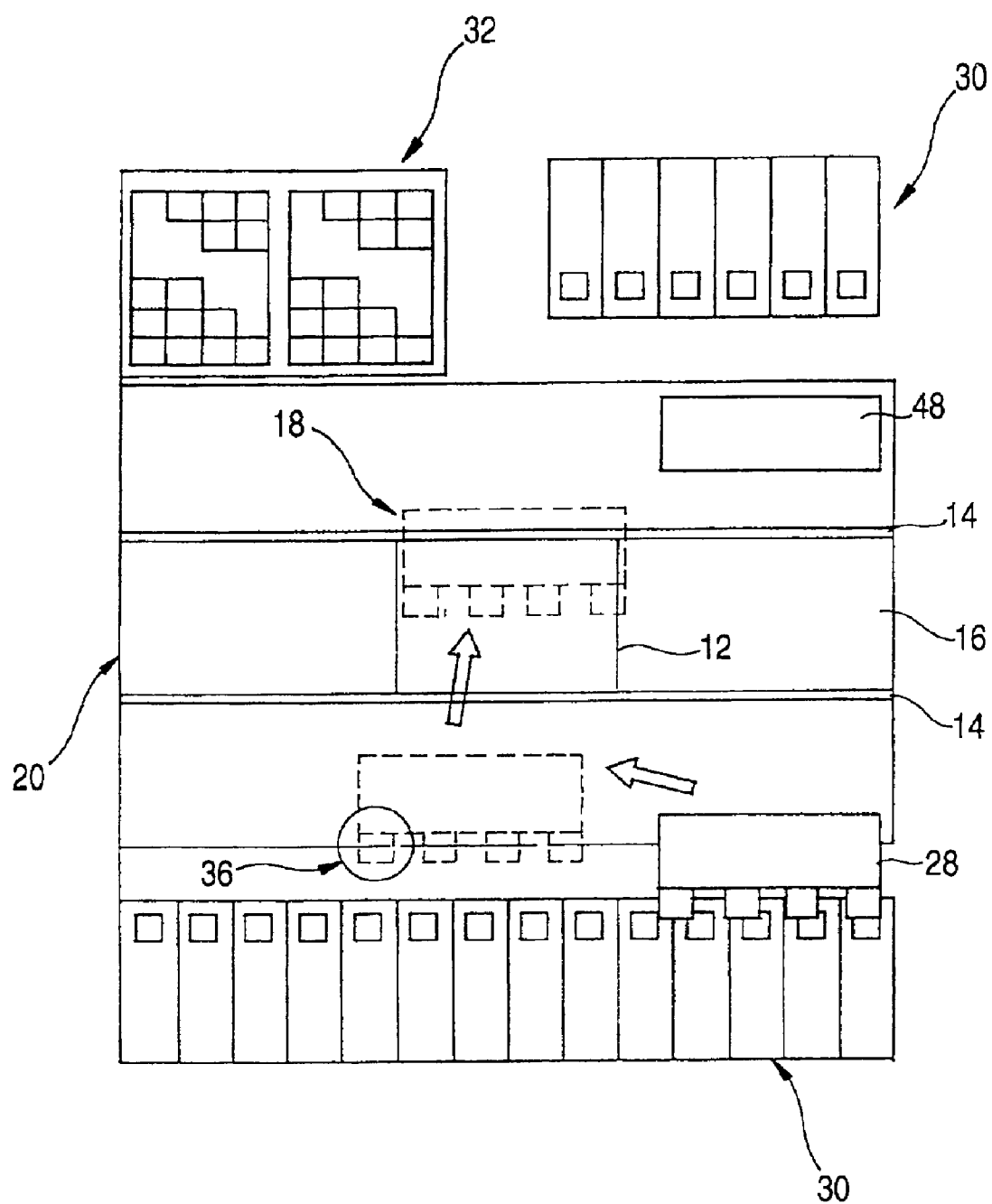
FIG. 3 is a schematic plan view of the electronic parts mounting apparatus.
Figure 4:
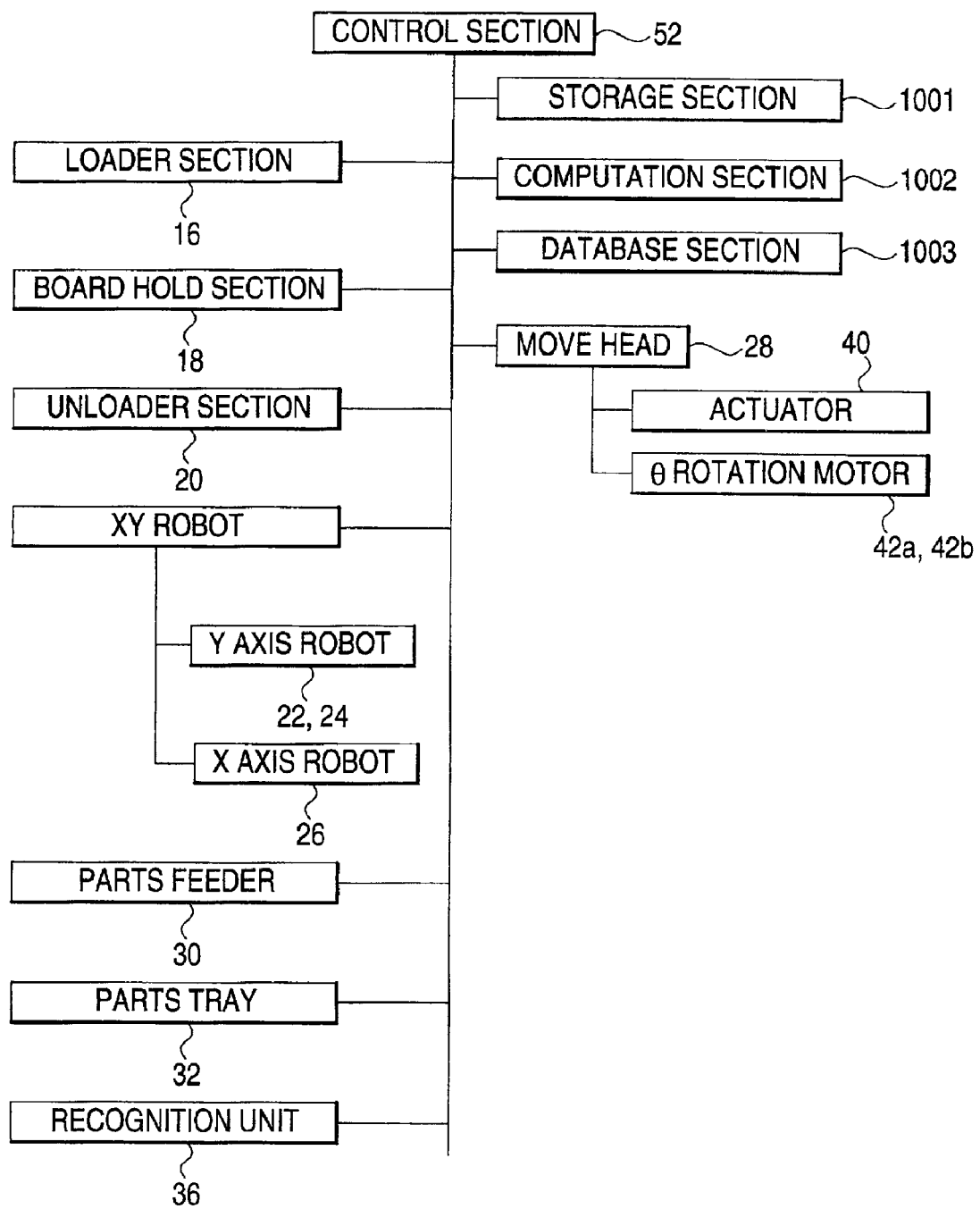
FIG. 4 is a block diagram to show the configuration of the electronic parts mounting apparatus.

FIG. 1 is a perspective view of an electronic parts mounting apparatus used with the invention, FIG. 2 is an enlarged perspective view of a move head as a suction section, FIG. 3 is a schematic plan view of the electronic parts mounting apparatus, and FIG. 4 is a block diagram to show the configuration of the electronic parts mounting apparatus.

An electronic parts mounting apparatus 100 makes it possible to mount parts on a circuit board consisting of a plurality of small boards such as multiple-side boards and hybrid boards by selectively switching an expansion method as an improvement of a step repeat method or a pattern repeat method in related arts and further is intended for enhancing the mounting efficiency for shortening the mounting time by simultaneously sucking parts with a plurality of suction nozzles 34 also on other circuit boards including one-side boards.

As shown in FIG. 1, a pair of guide rails 14 for a circuit board 12 is placed on a loader section 16, a board hold section 18, and an unloader section 20 at the center of the top of a base 10 of the electronic parts mounting apparatus 100, and as conveyor belts with which the guide rails 14 are provided are driven synchronously, the circuit board 12 is transported from the pair of guide rails 14 of the loader section 16 on one end side to the pair of guide rails 14 of the board hold section 18 placed at a position where parts, for example, electronic parts are to be mounted and from the pair of guide rails 14 of the board hold section 18 to the pair of guide rails 14 of the unloader section 20 on an opposite end side. In the board hold section 18, the transported circuit board 12 is positioned and held for mounting parts thereon.

Y axis robots 22 and 24 are placed on both sides above the base 10 above the circuit board 12 and an X axis robot 26 is placed on the two Y axis robots 22 and 24 and can be advanced and retreated in a Y axis direction as the Y axis robots 22 and 24 are driven. A move head 28 is attached to the X axis robot 26 and can be advanced and retreated in an X axis direction, so that it is made possible to move the move head 28 in the X-Y plane. Each robot is formed, for example, by forward and reversely rotating a ball screw by a motor, making it possible to advance and retreat a nut member screwed to the ball screw in the corresponding axis direction, and fixing the member to be advanced and retreated onto the nut member.

The move head 28 which is placed on the XY robot (a part of move head move apparatus) consisting of the X axis robot 26 and the Y axis robots 22 and 24 and is movable on the X-Y plane (for example, horizontal plane or plane roughly parallel to the top of the base 10) can suck any desired electronic part with a suction nozzle 34 from a plurality of parts feeders as one example of parts supply section for supplying electronic parts, such as resistor chips and chip capacitors, or a parts tray 32 as another example of parts supply section for supplying comparatively large-sized electronic parts such as connectors and ICs of SOP (small outline package), QFP (quad flat package), etc., and can place the electronic part at the parts placement position of the circuit board 12. Such electronic parts mounting operation is controlled by a control section 52 in FIG. 4 based on a preset mounting program stored in a storage section 1001.

The parts feeders 30 and the parts tray 32 correspond to examples of the parts supply section. The arrangement spacing of parts in the parts supply section means the spacing between parts supply ports of the adjacent parts feeders 30 or means the spacing between storage cavities for storing parts in the parts tray 32.

A large number of parts feeders 30 are placed side by side on both sides in the transport direction of the pair of guide rails 14 (upper right and lower left sides of FIG. 1), and parts rolls like tape storing a large number of electronic parts, such as resistor chips and chip capacitors, are attached to the parts feeders 30.

As the parts tray 32, a total of two trays 32a each having a length in a direction orthogonal to the board transport direction of the pair of guide rails 14 can be placed. Each tray 32a is slid to the side of the pair of guide rails 14 in response to the number of supplied parts for keeping the parts taking-out position in the Y direction at a constant position. A large number of electronic parts of QFP, etc., are placed on the tray 32a.

On the other hand, a parts recognition unit 36 for detecting a two-dimensional position shift (suction attitude) of an electronic part sucked to the suction nozzle 34 and making correction on the move head 28 side so as to cancel the position shift is placed on one side of the circuit board 12 positioned to the pair of guide rails 14.

As shown in FIG. 2, the move head 28 is formed as a multiple-head type comprising a plurality of (in the embodiment, four) placement heads, namely, a first placement head 38a, a second placement head 38b, a third placement head 38c, and a fourth placement head 38d joined side by side as an example of parts hold unit. The four placement heads 38a, 38b, 38c, and 38d are of the same structure and each placement head comprises a suction nozzle 34, an actuator 40 for causing the suction nozzle 34 to move up and down, and a pulley 46. The forward/reverse rotation drive force of a θ rotation motor 42a is transmitted by a timing belt 44 to the pulley 46 of the first placement head 38a and the pulley 46 of the third placement head 38c for causing both suction nozzles 34 to make θ rotation simultaneously (rotation around the axial core of the suction nozzle 34). The forward/reverse rotation drive force of a θ rotation motor 42b is transmitted by the timing belt 44 to the pulley 46 of the second placement head 38b and the pulley 46 of the fourth placement head 38d for causing both suction nozzles 34 to make θ rotation simultaneously.

Each actuator 40 is implemented as an air cylinder, for example, and the air cylinder can be turned on and off, thereby moving up and down the suction nozzle for selectively performing the parts holding or parts placement operation. As shown in FIG. 2, the power of the θ rotation motor 42a is transmitted over the timing belt 44 for causing the suction nozzles 34 of the attachment heads 38a and 38c to make θ rotation and the power of the θ rotation motor 42b is transmitted over the timing belt 44 for causing the suction nozzles 34 of the attachment heads 38b and 38d to make θ rotation; however, such a configuration is an example and each of the placement heads 38a, 38b, 38c, and 38d may be provided with a separate θ rotation drive motor for θ rotating the suction nozzle. However, to lessen the weight of the move head 28, it is preferable that the number of θ rotation drive motors each for θ rotating the corresponding suction nozzle is fewer.

The suction nozzle 34 of each placement head can be replaced with a spare and spare suction nozzles to replace are previously stored in a nozzle stocker 48 on the base 10 of the electronic parts mounting apparatus 100. As the suction nozzles 34, for example, an S size nozzle for sucking a minute chip part having a size of about 1.0×0.5 mm, an M size nozzle for sucking a QFP 18-mm square, and the like are available and an appropriate suction nozzle is used in response to the type of electronic part to be placed.

The operation of the described electronic parts mounting apparatus is as follows:

As shown in FIG. 3, when the circuit board 12 brought in from the loader section 16 of the pair of guide rails 14 is transported to the board hold section 18, the move head 28 moves in a lateral direction, in other words, in the X-Y plane by the XY robot, sucks any desired electronic part from the parts feeder 30 or the parts tray 32, moves to above an attitude recognition camera of the parts recognition unit 36, checks the electronic part for suction attitude, and drives the θ rotation motor based on the recognition result for θ rotating the suction nozzle 34 for performing the correction operation of the suction attitude. After this, the electronic part is placed at the parts placement position of the circuit board 12.

When each of the placement heads 38a, 38b, 38c, and 38d sucks an electronic part with the suction nozzle 34 from the parts feeder 30 or the parts tray 32 and places the electronic part at the parts placement position of the circuit board 12, the suction nozzle 34 is moved down in an up and down direction (Z direction) from the X-Y plane as the actuator 40 is actuated. The suction nozzle 34 is replaced with an appropriate suction nozzle in response to the type of electronic part and the placement operation is performed.

The above-described operation of sucking an electronic part and placing the electronic part on the circuit board 12 is repeated, whereby mounting the electronic part on the circuit board 12 is completed. The circuit board 12 where mounting the electronic part thereon is completed is transported from the board hold section 18 to the unloader section 20 and on the other hand, a new circuit board is brought into the board hold section 18 from the loader section 16 and the above-described operation is repeated.

The electronic parts mounting method of the embodiment for sucking electronic parts onto a plurality of suction nozzles 34 and mounting the electronic parts on a circuit board 12 is executed during the basic mounting operation of the electronic parts on the circuit board 12.

If the suction nozzles making up the suction section are placed with spacing equal to that between the supply positions of the parts supply section or with a multiple of spacing between the parts supply positions, the electronic parts can be simultaneously sucked with the suction nozzles. However, variations in position relative to the suction nozzles 34 and variations in center 62a of electronic part 62 caused by a parts supply position shift coming from the parts supply section 30, 32 will cause a position shift between the suction nozzle and the center of the electronic part.

Figure 5:
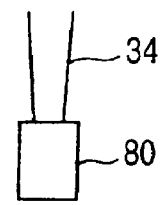
FIGS. 5(a) to 5(d) are drawings to show a state in which an inspection jig is temporarily placed on the tip of a suction nozzle and a state of viewing the inspection jig from below.
Figure 5:
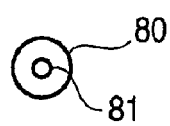
Figure 5:
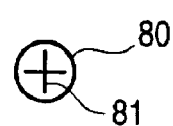
Figure 5:
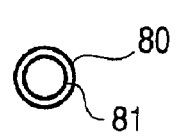

Specifically, first, for the variation in center position of each suction nozzle 34, an inspection jig is attached to each suction nozzle 34 and then is recognized by the parts recognition unit 36 below the inspection jig and the variation is calculated based on the recognition result. The inspection jig may be any if it enables the center position of the suction nozzle 34 to be recognized as a result of picking up an image with the parts recognition unit 36. FIG. 5 shows an example of an inspection jig 80. That is, FIG. 5(a) is a drawing to show a state in which the inspection jig 80 is temporarily placed on the tip of a suction nozzle and FIGS. 5(b) to 5(d) are drawings of viewing the inspection jig from below. The inspection jig 80 is provided with a center mark 81 at a position matching the center position of the suction nozzle 34 or in the surrounding thereof. The parts recognition unit 36 can calculate the center position of the suction nozzle 34 by identifying the center mark 81. Various marks like a circle, a cross line, a ring, etc., may be used as the center mark 81. It is assumed that the inspection jig 80 is precise with no error when the inspection jig 80 is placed on the suction nozzle 34 and that the center position of the suction nozzle 34 detected by the inspection jig 80 does not shift from the essential center position of the suction nozzle 34.

To find the center position of the suction nozzle 34, the tip face of the suction nozzle 34 may be imaged from below and be subjected to image processing, thereby calculating the center position of the suction nozzle 34 without using the above-mentioned inspection jig.

More preferably, the rotation center of the suction nozzle 34 is calculated from the center position of the suction nozzle 34 found in the state of each angle of rotating the suction nozzle 34 solely or the suction nozzle 34 on which the inspection jig 80 is placed at 0°, 90°, 180°, and 270° and the rotation center is adopted as the center position of the suction nozzle 34 without recognizing and finding the center position of the suction nozzle 34 in the state of a constant rotation angle of the suction nozzle 34 as described above. In doing so, the shift amount of the suction nozzle 34 also considering the eccentricity of the axial core of the suction nozzle 34 can be found.

Further, without placing the inspection jig 80 on the tip of the suction nozzle 34, an inspection jig with a center mark 81 at the center may be placed on the move head 28 in place of the suction nozzle 34 and the center position may be recognized by the parts recognition unit 36.

Figure 6:
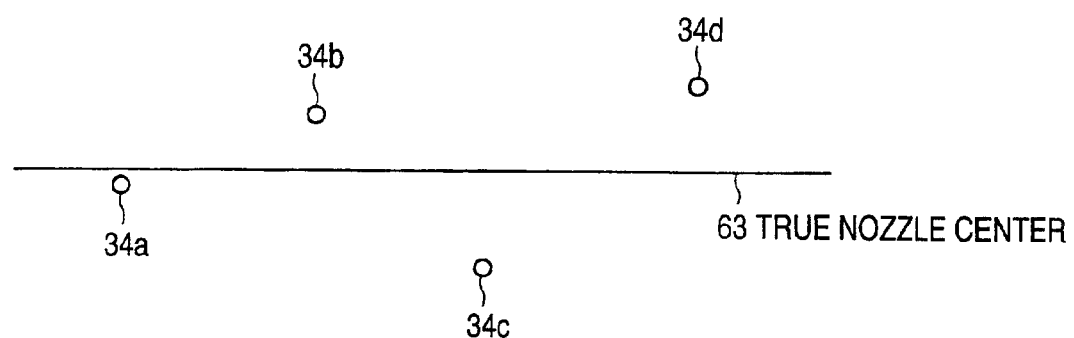
FIG. 6 is a drawing to show the positional relationship between actual suction nozzle centers and true suction nozzle center.

As an example is shown in FIG. 6, center positions 34a, 34b, 34c, and 34d of the suction nozzles 34 measured with an inspection jig attached thereto vary and a true nozzle center 63 is found based on the average value of the center positions.

Figure 7:
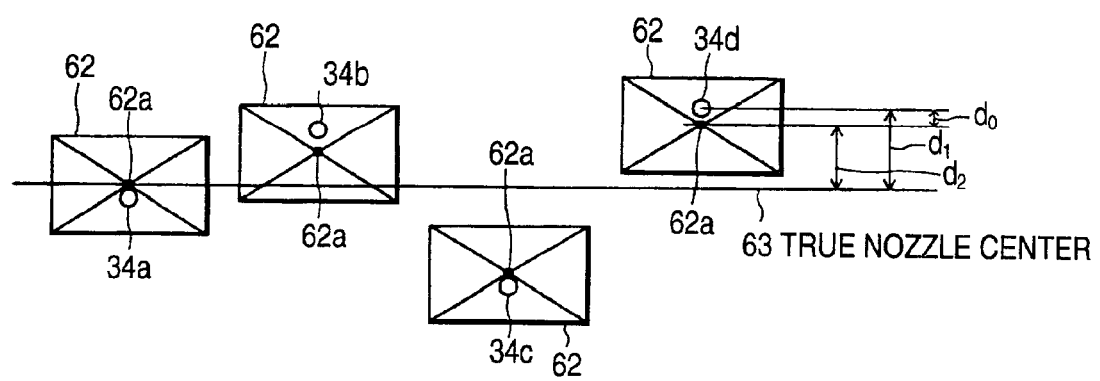
FIG. 7 is a drawing to show the positional relationship between actual suction nozzle centers and electronic parts centers.

FIG. 7 shows a case of superposing the variation state in centers 62a of parts 62 sucked with the suction nozzles on the drawing showing the center positions 34a, 34b, 34c, and 34d of the suction nozzles in FIG. 6; the average line of the centers 62a of the parts 62 is superposed on the true nozzle center 63. The variations in the center positions of the suction nozzles with the center 62a of the electronic part as the reference are illustrated as in FIG. 8. That is, the shift amount relative to each suction nozzle when the centers 62a of the electronic parts shown in FIG. 7 are shifted in line for arranging the parts 62 is contained in the range of an area W indicating the range of one arbitrary value. The one arbitrary value indicates the allowable range of shift amount enabling simultaneous suction and a value of 10% to 30% of the short side of a chip part is set; for example, in 1005 parts, 0.1 mm is used from the parts size and in 0603 parts, 0.05 mm is used.

Figure 8:
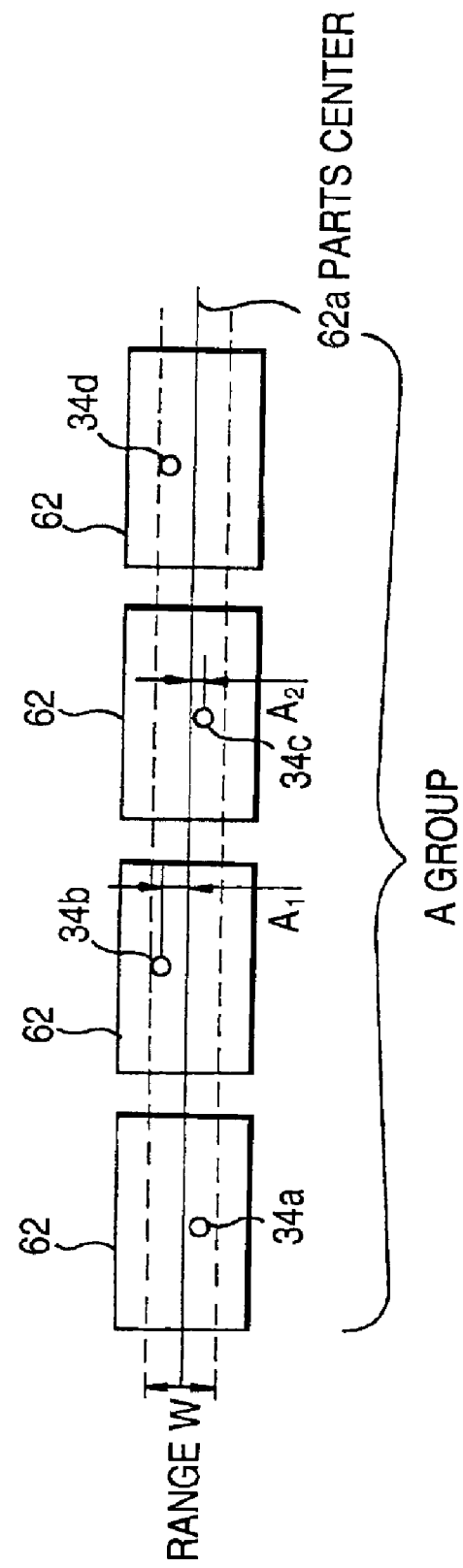
FIG. 8 is a schematic representation when the positional relationships between electronic parts set in a part supply section and suction nozzles are set as one group.

In the state shown in FIG. 8, the centers 34a, 34b, 34c, and 34d of the suction nozzles 34 are contained in the range of the area W and thus all suction nozzles 34 are handled as the same group (A group) and electronic parts are sucked to all suction nozzles 34. Here, the average value of maximum value A1 and minimum value A2 of the shift amount between the center 62a of electronic part and the centers 34a, 34b, 34c, and 34d of the suction nozzles, (A1+A2)/2, is used as a position correction value and the suction positions of the suction nozzles 34 are corrected.

That is, correction is made so that the line of the true nozzle center 63 is shifted by the position correction value relative to the average line of the centers 62a of the parts 62.

The higher in FIG. 8 the center, the larger the shift amount and the lower the center, the smaller the shift amount. A plus value is applied above the parts center 62a and a minus value is applied below the parts center 62a. In the example, 34d is the maximum value and 34a is the minimum value.

Figure 9:
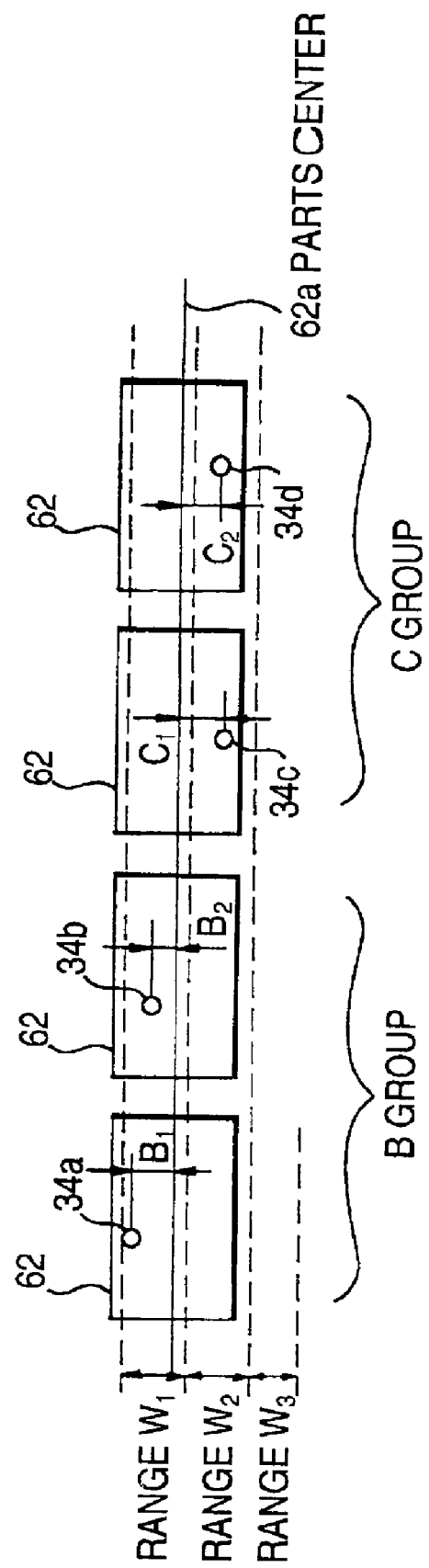
FIG. 9 is a schematic representation when the positional relationships between electronic parts set in a part supply section and suction nozzles are set as more than one group.

On the other hand, in the state shown in FIG. 9, the range of the shift amount between the electronic parts center 62a and the suction nozzle centers 34a, 34b, 34c, and 34d caused by variations in the center positions of the suction nozzles 34 and variations in electronic parts positions relative to the parts supply section 30, 32 exceeds an area W1 of the range of one arbitrary value (the same width as W mentioned above). In this case, if only one simultaneous suction operation is performed for each suction nozzle 34, electronic parts cannot stably be sucked. Thus, the suction nozzles 34 that can be stably sucked at the same time are grouped and the simultaneous suction operation is performed for each group, whereby the stable suction operation is accomplished. That is, in the example shown in FIG. 9, they are classified into a group of the suction nozzle centers 34a and 34b (B group consisting of the left two suction nozzles) and a group of the suction nozzle centers 34c and 34d (C group consisting of the right two suction nozzles). A position correction value is found and the suction positions are corrected in a similar manner for each group.

Next, the described electronic parts mounting method will be discussed in more detail based on a flowchart indicating the procedure of the electronic parts mounting method shown in FIG. 10.

First, an inspection jig is attached to each suction nozzle 34 and is recognized by the parts recognition unit 36, thereby measuring the center position of the provided suction nozzle 34. The average position of the provided center positions of the suction nozzles 34 (true nozzle center 63, see FIG. 6) is found and the shift amount from the true nozzle center 63 is acquired as an initial value (step 1 or S1).

The initial value becomes the shift amount for each suction nozzle 34. In contrast, the shift amount between the electronic parts center 62a sucked at the electronic parts suction position in the parts supply section 30, 32 and the suction nozzle center 34a, 34b, 34c, 34d also contains the shift amount from the true position of the parts supply section 30, 32. That is, specifically in the example of the suction nozzle center 34d in FIG. 7, a shift amount d0 between the suction nozzle center 34d and the parts center 62a at the electronic parts suction position is the sum of a shift amount d1 of the suction nozzle center 34d relative to the true nozzle center 63 and a shift amount d2 of the electronic parts position of the parts supply section 30, 32 relative to the true parts supply section center (in FIG. 7, the shift amount of the suction nozzle center 34 from the true nozzle center 63 is set to a plus above the figure and the shift amount of the parts center 62a from the true nozzle center 63 (true parts center) is set to a plus below the figure. Thus, d2 becomes a negative value.) Thus, the electronic parts mounting apparatus 100 holds as many nozzle shift amount data pieces as the number of combinations of [number of parts stored in the parts supply section (corresponding to the installed number of the parts feeders 30 or the parts trays 32)] and [number of suction nozzles] in a database section 1003 (FIG. 4). The initial value is entered by entering only the shift amount of the suction nozzle 34 with the shift amount of the parts supply section 30, 32 set to zero. However, if the stationary shift amount of the parts center position 62a is previously known, the shift amount is also entered.

Next, the maximum value and the minimum value of the shift amounts of the suction nozzles 34 obtained at S1 are found and whether or not the difference between the maximum value and the minimum value is equal to or less than one arbitrary value W1 is determined (S2). W1 means an arbitrary value to set a first group in W. Likewise, W2 described later means an arbitrary value to set a second group. If the difference is equal to or less than W1, all suction nozzles 34 is set in one group (S3) because stable suction can be accomplished if the simultaneous suction operation of all suction nozzles 34 is performed. On the other hand, if the difference is greater than W1, the suction nozzles 34 are grouped so that stable suction can be accomplished.

In the grouping processing, as shown in FIG. 9, first, suction nozzles each involving the nozzle shift amount within the range W1 of the arbitrary value from the suction nozzle 34a having the maximum shift amount from the parts center 62a are extracted and grouped (S4). That is, the suction nozzles 34a and 34b are contained in the range W1 and thus are grouped as the same group (B group).

Next, whether all suction nozzles 34 have been grouped is determined (S5). If any suction nozzle not grouped remains, control returns to S4 and the grouping processing is repeated. That is, suction nozzles each involving the nozzle shift amount within the range W2 set following the range W1 and having the same width as W1 are extracted and grouped. Then, the suction nozzles 34c and 34d are contained in the range W2 and thus are grouped as the same group (C group).

After completion of the grouping in such a manner, a position correction value is calculated for each group (S6). The average value of the maximum value and the minimum value of the nozzle shift amounts in each group is used as the position correction value. That is, (B1+B2)/2 is used as the position correction value in B group (maximum value B1, minimum value B2) and (C1+C2)/2 is used as the position correction value in C group (maximum value C1, minimum value C2).

Next, the position of the move head 28 is corrected in response to the position correction value, and the simultaneous suction operation is performed for each setup group for sucking electronic parts to the suction nozzles 34 (S7).

When the simultaneous suction is performed for each group for sucking the parts to all suction nozzles 34, the move head 28 is moved to above the parts recognition unit 36 for recognizing all sucked parts (S8). The shift amount between the parts center 62a and the suction nozzle center is corrected in response to the recognition result of each part at S8 and the part is mounted at the mount position (59)

Whether all parts have been normally mounted is determined (S10) If all parts have been mounted, the processing is terminated. If not all parts have been normally mounted for the reason that there is a suction nozzle 34 where the part cannot normally be sucked or that the shift amount between the parts center and the suction nozzle center exceeds the allowable value W although the position of the move head is corrected in response to the recognition result at S8 or for any other reason, the shift amount between the suction nozzle center 34a, 34b, 34c, 34d and the electronic parts center 62a, calculated based on the image data provided by the parts recognition unit 36 is updated in the database section 1003 with the shift amount between each suction nozzle 34 and the parts center in the parts supply section 30, 32 as data (S11). After data registration is executed, control returns to S2 and steps S2 to S10 are repeated based on the shift amount updated at S11.

The determination as to whether all parts have been mounted at S10 may be a determination as to whether or not the end of the mounting program is reached (parts have been mounted on one circuit board). In this case, the recognition result at S8 is stored as much as one scan of the mounting program and the shift amount update result is reflected on mounting parts on another circuit board.

In the example, correction in the feeding direction of the electronic parts 62 in the parts supply section 30, 32 has been described; correction is also made in a similar manner in a direction orthogonal to the feeding direction of the electronic parts 62. As arbitrary values used for grouping at this time, for example, in 1005 parts, 0.2 mm is used and in 0603 parts, 0.1 mm is used.

Thus, in the electronic parts mounting method of the embodiment, to correct the variations in positions of the suction nozzles 34 and the variations in parts supply positions in the parts supply section 30, 32, if the difference between the maximum value and the minimum value of the shift amounts of the suction nozzles 34 relative to the parts centers is equal to or less than the predetermined value, it is determined that the suction nozzles 34 and the electronic parts 62 are placed with position accuracy within the allowable range, and stable parts suction is accomplished if the simultaneous suction operation of all suction nozzles 34 is performed.

On the other hand, if the difference between the maximum value and the minimum value of the shift amounts is greater than the predetermined value, the suction nozzles 34 are separated into a group of the suction nozzles each with the shift amount equal to or less than the predetermined value, namely, placed within the allowable range and another group placed outside the allowable range, and the position of the move head 28 is corrected for each group. Therefore, it is made possible substantially to make position correction in the suction nozzle units, stable parts suction can be performed for each group, and it is also made possible to stably suck minute resistors and capacitors of 0603, 1005, etc., for example, with high accuracy.

If the centers 34a, 34b, 34c, and 34d of the suction nozzles 34 are contained in the allowable range, the simultaneous suction with all suction nozzles in the group is made possible with the state intact. However, the position of the move head 28 is corrected using the average value of the maximum value and the minimum value of the shift amounts described above, whereby correction is made so that the move distances of the move head 28 are averaged relative to the suction nozzles 34a, 34b, 34c, and 34d, and more stable suction is made possible.

Further, in the electronic parts mounting method of the embodiment, the shift amount between the center of the suction nozzle 34 and the center 62a of the electronic part 62 is detected based on the image data from the parts recognition unit 36 provided each time the part is sucked at the electronic parts mounting time (S8, S11), and the position correction value of the suction section and the group of the suction nozzles where the simultaneous suction operation is to be performed can also be changed in response to the shift amount. In doing so, for any other shift than a stationary shift caused by dimension tolerances, etc., namely, a varying shift occurring at the suction time, it is also made possible to make flexible position correction following the change. The position correction value or the group may be changed after the predetermined number of times or the expiration of a predetermined time interval or when the shift amount becomes equal to or greater than a predetermined value in addition to each time the part is sucked.

Figure 10:
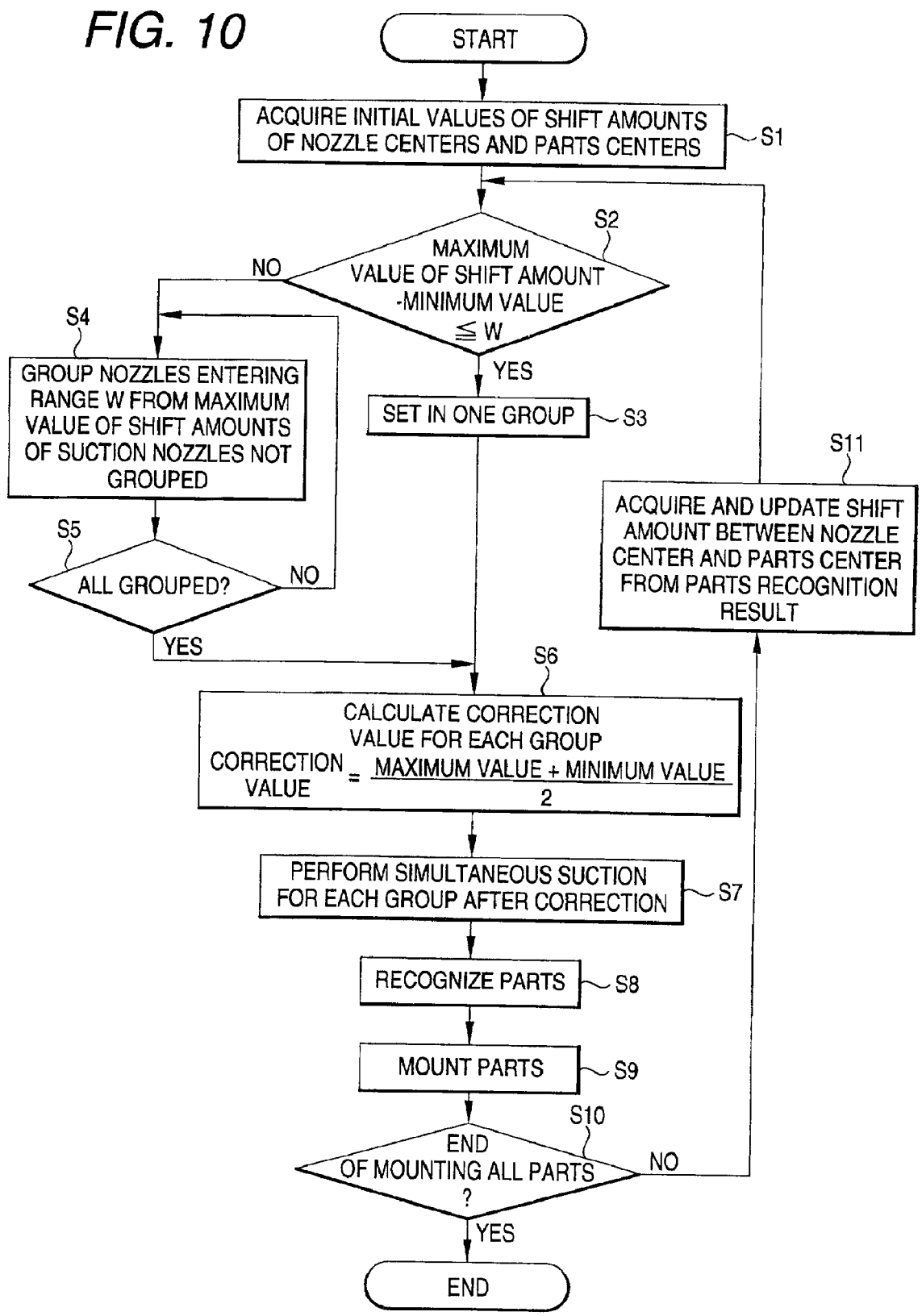
FIG. 10 is a flowchart to show the procedure of an electronic parts mounting method in a first embodiment of the invention.

In the embodiment, at S1 in FIG. 10, the variations in the parts center positions 62a are set to zero or previously known values are entered, but a part at the parts suction position may be imaged with a camera placed on the move head 28 before the part is sucked, and the shift amount of the parts center position 62a may be found.

Figure 11:
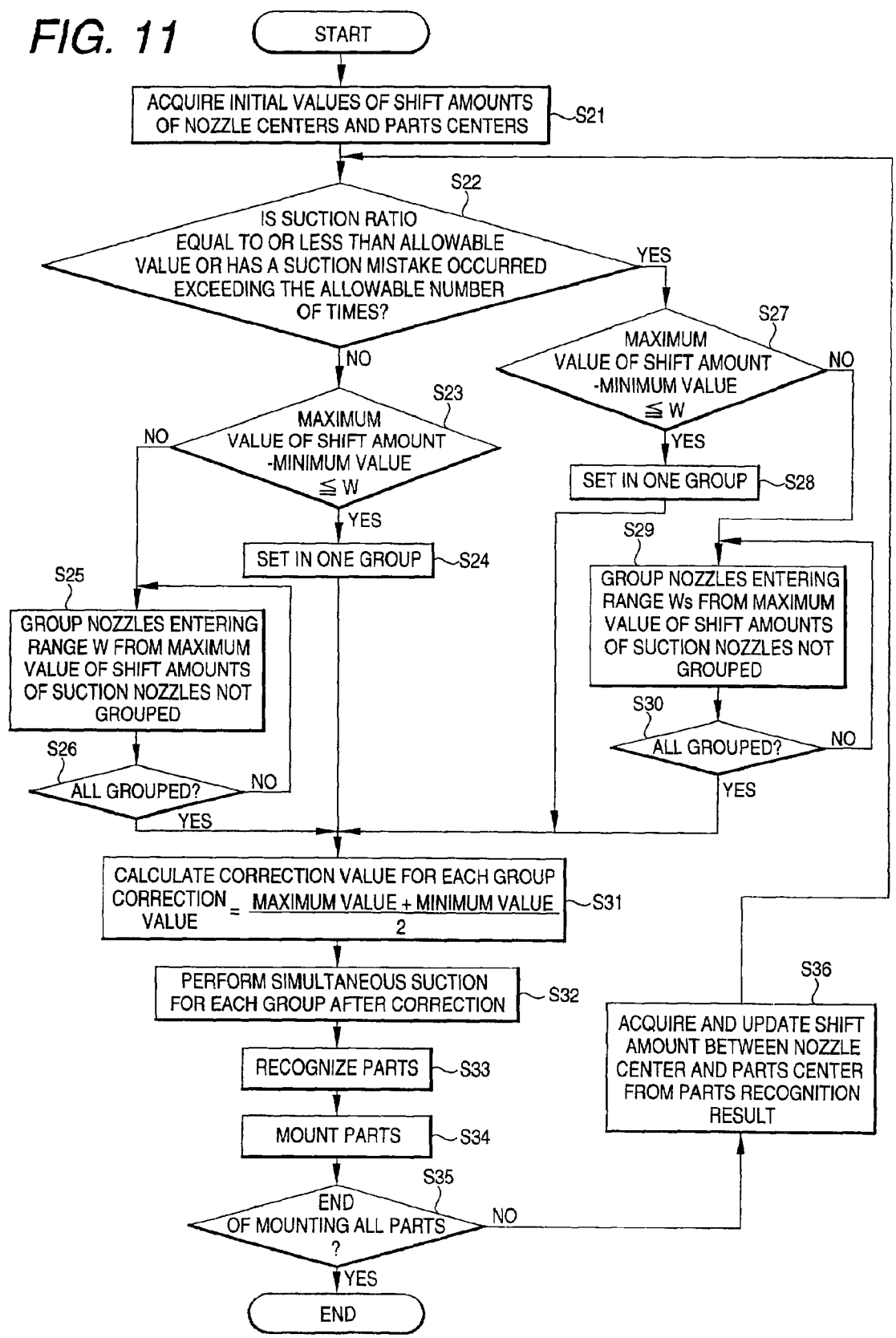
FIG. 11 is a flowchart to show the procedure of an electronic parts mounting method in a second embodiment of the invention.

Next, a second embodiment of electronic parts mounting method according to the invention will be discussed based on a flowchart in FIG. 11.

In the electronic parts mounting method according to the embodiment, a suction nozzle 34 where a parts suction mistake has occurred a predetermined number of times or a suction nozzle 34 where the electronic parts suction ratio is a predetermined value or less is classified into a specific group different from the above-described groups and the suction operation is performed in the group of the suction nozzles 34 (S22). The specific group is a group provided by setting the width W in the allowable range narrower than that in the normal group (Ws at S27).

According to the electronic parts mounting method, a suction nozzle 34 where a parts suction mistake has occurred a predetermined number of times or a suction nozzle 34 where the electronic parts suction ratio is a predetermined value or less is classified into a specific group, and the position of the move head 28 is corrected in the specific group. Thus, if there are variations in suction forces of the suction nozzles, etc., it is made possible to make finer position correction to a suction nozzle 34 with a low suction ratio in such a manner that a point near a parts center position as much as possible is sucked with the suction nozzle 34, and the stable suction operation with each suction nozzle 34 can be accomplished.

The suction nozzle 34 with the suction ratio equal to or less than the predetermined value may be contained in the normal group (width W in allowable range) rather than the specific group and may be positioned at the center of the width W.

Figure 12:
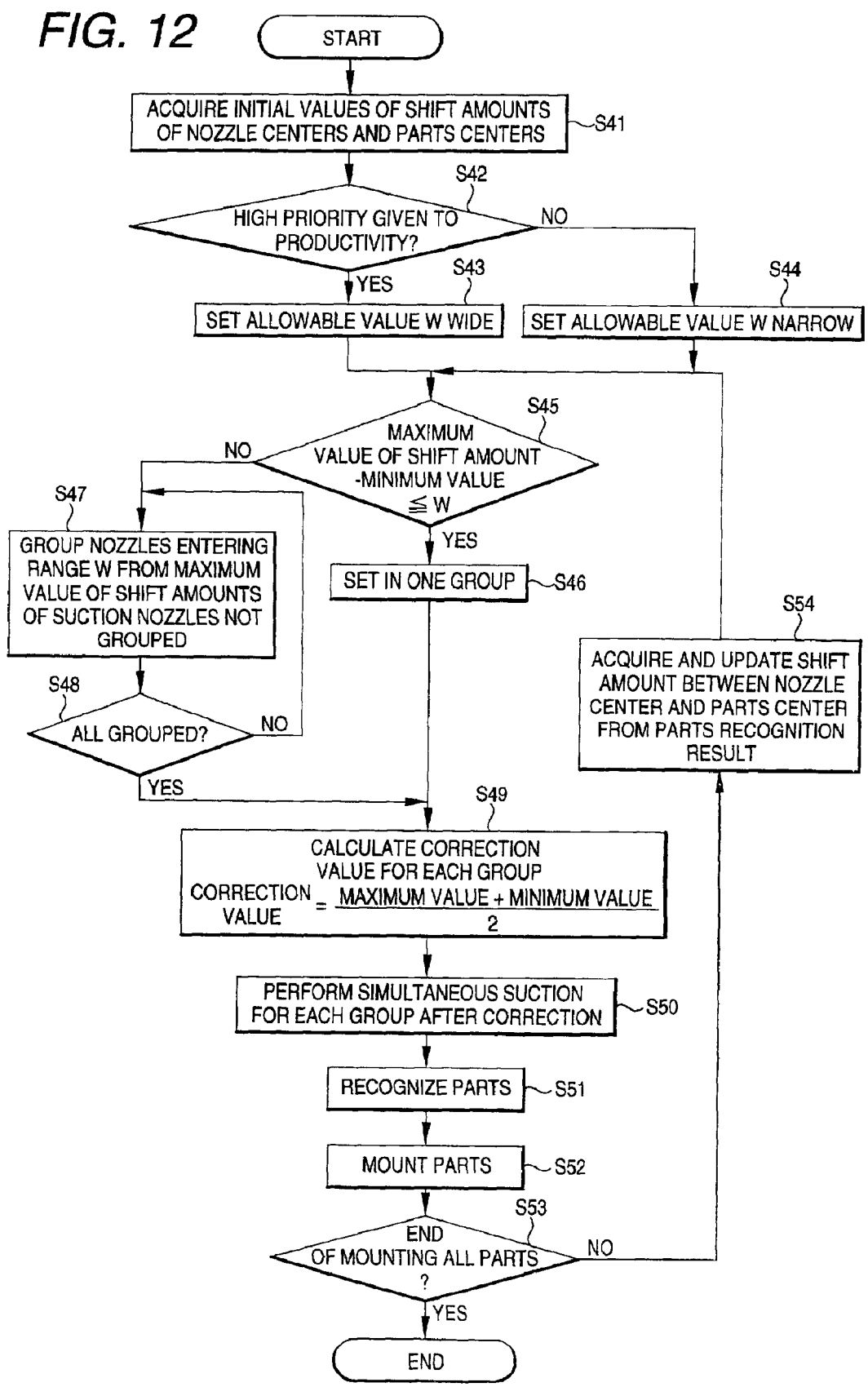
FIG. 12 is a flowchart to show the procedure of an electronic parts mounting method in a third embodiment of the invention.

Next, a third embodiment of electronic parts mounting method according to the invention will be discussed based on a flowchart in FIG. 12.

In the electronic parts mounting method according to the embodiment, grouping for performing simultaneous suction is set in multiple steps between a mode giving high priority to productivity (throughput, etc.,) and a mode giving high priority to the suction ratio. Specifically, the width W of the allowable range of the group width is set in multiple steps. To give high priority to productivity, W is set wide (S43); to give high priority to the suction ratio, W is set narrow (S44). Therefore, the user can perform the suction operation in any desired mode selected in response to the purpose (S42).

According to the electronic parts mounting method, it is made possible for the user to select the value of the shift amount between the center of the suction nozzle 34 used in the grouping mentioned above and the center 62a of the electronic part 62 at an electronic part suction position, and grouping in the mode fitted for the electronic parts 62 or the suction nozzles 34 is made possible. As the selection at this time, the user may only select any of the stepwise setup modes and thus the usability can also be enhanced.

For example, five steps, etc., of a step giving the highest priority to productivity to a step giving the highest priority to the suction ratio are provided and the user selectively sets any one of the provided steps, whereby the appropriate suction operation responsive to the purpose can be provided easily.

Next, a fourth embodiment of electronic parts mounting method according to the invention will be discussed.

In the electronic parts mounting method according to the embodiment, the feed amount of an electronic part 62 in the parts supply section 30, 32 is changed, thereby correcting the shift amount between the center 62a of the electronic part 62 at an electronic parts suction position and the center of the suction nozzle 34.

In the embodiment, a parts feed mechanism capable of changing the feed amount of each electronic part 62 as desired is installed in the parts supply section 30, 32. Accordingly, when an electronic part 62 is sucked, the shift amount between the center of the electronic part 62 to be sucked and the center of the suction nozzle 34 is corrected by changing the parts feed amount.

Figure 13:
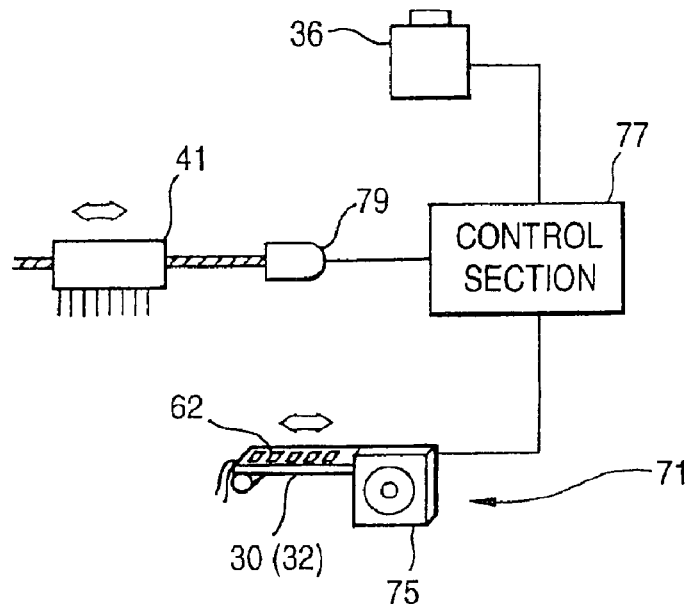
FIG. 13 is a control block diagram of a parts feed mechanism in a fourth embodiment of the invention.
Figure 14:
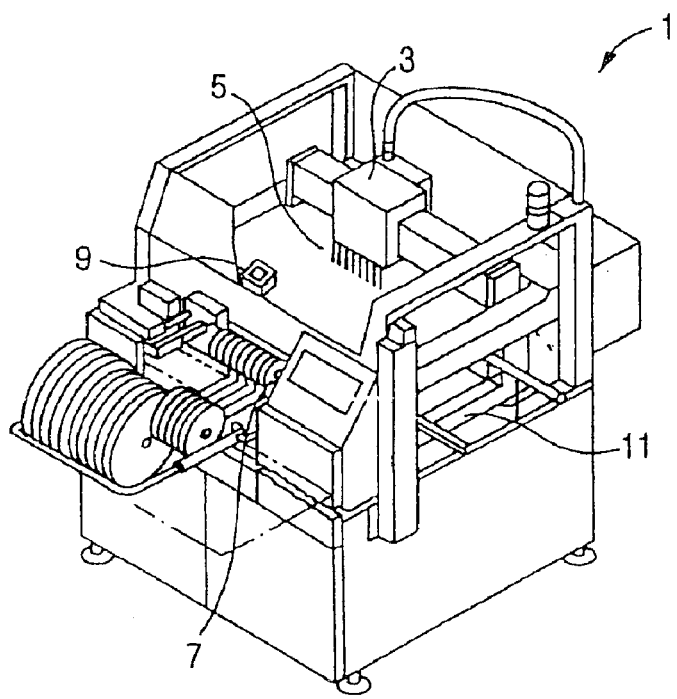
FIG. 14 is a schematic drawing of an electronic parts mounting apparatus used with an electronic parts mounting method in a related art.

FIG. 13 is a control block diagram of the parts feed mechanism. The parts feed mechanism 71 shown in FIG. 13 has a parts feeder 75 for moving the electronic parts 62 stored in the parts supply section 30, 32 in a parts feed direction. The parts feeder 75 drives a conveyor, for example, thereby moving the electronic part 62 placed on the conveyor upstream or downstream in the feed direction. Driving the parts feeder 75 is controlled by a control section 77 of the electronic parts mounting apparatus 100.

According to the parts feed mechanism 71, when image data provided by the parts recognition unit 36 imaging the attitude of an electronic part sucked onto a suction nozzle is sent to the control section 77, the control section 77 calculates the shift amount between the center of the electronic part 62 sucked on the suction nozzle and the nozzle center based on the image data and performs feedback control of the shift amount. That is, the control section 77 sends a command based on the calculated shift amount to the parts feeder 75 for correcting the shift amount for each parts supply section. For correction in a direction orthogonal to the feed direction, the correction amount is calculated based on the above-described electronic parts mounting method and a command is sent to an operation motor 79 of the move head 28 and correction is made on the move head 28 side.

According to the electronic parts mounting method according to the embodiment, the feed amount of the electronic part 62 in the parts supply section 30, 32 can be changed as desired, whereby when the electronic part 62 is sucked, the shift between the center of the sucked electronic part 62 and the center of the suction nozzle 34 can be corrected by changing the parts feed amount in the parts supply section 30, 32, so that the shift amount is corrected and the simultaneous suction operation is made possible in a more stable state.

As described above in detail, according to the parts mounting method and the parts mounting apparatus according to the invention, when the suction section is moved to the parts supply section in which a plurality of parts are stored so that they can be sucked at the same time, the parts stored in the parts supply section are sucked onto the plurality of suction nozzles at the same time, and the sucked parts are mounted on a board, all suction nozzles each involving a shift amount within an allowable range in which simultaneous suction is possible are set in one group and suction nozzles each involving a shift amount outside the allowable range in which simultaneous suction is possible are set in a different group and the parts are sucked at the same time for each of the groups, whereby the position of the suction section is corrected for each group, it is made possible substantially to make position correction in the suction nozzle units, and stable parts suction can be performed for each group. Therefore, if suction nozzles undergoing position correction in suction section units as in the related art are used, it is made possible to simultaneously suck minute parts onto the suction nozzles and productivity of mounting parts can be improved.

What is claimed is:

1. Electronic parts mounting method, comprising the steps of:
   moving a suction section, including a plurality of suction nozzles, to a parts supply section in which a plurality of the electronic parts are stored so that the electronic parts can be sucked at the same time,
   sucking the electronic parts stored in the parts supply section onto the plurality of suction nozzles at the same time; and
   mounting the sucked electronic parts on a board,
   wherein the plurality of suction nozzles are classified into groups according to a shift amount of the plurality suction nozzles, a first group including first suction nozzles having a shift amount within an allowable range for simultaneous suction, and a second group including second suction nozzles having a shift amount outside the allowable range for simultaneous suction,
   and then the electronic parts are sucked at the same time by the first and second groups,
   wherein the shift amount is between the center of each of the plurality of suction nozzles and the center of an electronic part,
   the shift amount is found by a parts recognition unit for recognizing a suction state of the electronic part onto one of the plurality of suction nozzles, and
   the first and second groups of the suction nozzles and a position correction value of the suction section at each group are changed according to the shift amount.

2. The electronic parts mounting method according to claim 1:
   wherein the shift amount is defined between the electronic parts sucked by the first suction nozzles and the second suction nozzles.

3. The electronic parts mounting method according to claim 1,
   wherein the plurality of suction nozzles are classified into one of the first group and the second group in order to suck the parts,
   wherein, at said each group classified, errors for suction have occurred exceeding a predetermined number of times or a parts suction ratio is less than a predetermined value.

4. The electronic parts mounting method according to claim 1 further comprising:
   selecting a mode of allowable range for simultaneous suction from several modes; and
   setting the selected mode in order to classify the plurality of suction nozzles into several groups according to the modes,
   wherein the modes are divided into several ranks between a mode for giving high priority to productivity and a mode for giving high priority to parts suction ratio.

5. The electronic parts mounting method according to claim 2,
wherein the shift amount between the center of an electronic part at a parts suction position and the center of each of the plurality of suction nozzles,
and the shift amount is corrected by changing a feed amount of the electronic parts from the parts supply section.

6. Electronic parts mounting method, comprising the steps of:
moving a suction section, including a plurality of suction nozzles, to a parts supply section in which a plurality of the electronic parts are stored so that the electronic parts can be sucked at the same time,
sucking the electronic parts stored in the parts supply section onto the plurality of suction nozzles at the same time;
mounting the sucked electronic parts on a board,
wherein the plurality of suction nozzles are classified into groups according to a shift amount of the plurality of suction nozzles, a first group including first suction nozzles having a shift amount within an allowable range for simultaneous suction, and a second group including second suction nozzles having a shift amount outside the allowable range for simultaneous suction,
and then the electronic parts are sucked at the same time by the first and second groups;
wherein the shift amount is defined between the electronic parts sucked by the first suction nozzles and the second suction nozzles; and
calculating a position correction value of each suction section according to the shift amount of the first and second groups,
wherein the electronic parts are sucked at the same time by the first and second groups after correcting a position of each suction section by using the position correction value.

7. The electronic parts mounting method according to claim 6,
wherein the position correction value of each suction section is an average of a maximum and a minimum of the shift amount,
wherein the shift amount is defined between a center of each of the plurality of suction nozzles and a center position of an electronic part at a parts suction position.

8. Electronic parts mounting method, comprising the steps of:
moving a suction section, including a plurality of suction nozzles, to a parts supply section in which a plurality of the electronic parts are stored so that the electronic parts can be sucked at the same time,
sucking the electronic parts stored in the parts supply section onto the plurality of suction nozzles at the same time;
mounting the sucked electronic parts on a board,
wherein the plurality of suction nozzles are classified into groups according to a shift amount of the plurality of suction nozzles in each group, a first group including first suction nozzles having a shift amount within an allowable range for simultaneous suction, and a second group including second suction nozzles having a shift amount outside the allowable range for simultaneous suction,
and then the electronic parts are sucked at the same time by the first and second groups;
wherein the shift amount is defined between the electronic parts sucked by the first suction nozzles and the second suction nozzles;
detecting each position of the plurality of the suction nozzles; and
calculating a shift amount according to the each position detected,
wherein the shift amount is defined between a center position of the plurality of suction nozzles and a center position of the electronic parts at the point where the electronic parts are sucked.

9. The electronic parts mounting method according to claim 8,
wherein the center position of the plurality of suction nozzles is detected after recognizing a tip face of each of the plurality of suction nozzles.

10. The electronic parts mounting method according to claim 9,
wherein the center position of the plurality of suction nozzles is detected after placing an inspection jig on each of the plurality of suction nozzles.

11. The electronic parts mounting method according to claim 6,
wherein the shift amount is between the center of each of the plurality of suction nozzles and the center of an electronic part,
the shift amount is found by a parts recognition unit for recognizing the suction state of the electronic part onto one of the plurality of suction nozzles, and
the first and second groups of the suction nozzles and the position correction value of the suction section at each group are changed according to the shift amount,
wherein the electronic parts are sucked simultaneously at each of the first and second groups.

* * * * *